(12) United States Patent
Popovici et al.

(10) Patent No.: US 10,387,584 B1
(45) Date of Patent: Aug. 20, 2019

(54) STREAMING ON HARDWARE-SOFTWARE PLATFORMS IN MODEL BASED DESIGNS

(71) Applicant: The MathWorks, Inc., Natick, MA (US)

(72) Inventors: Katalin Maria Popovici, Natick, MA (US); Rajiv Ghosh-Roy, Hudson, MA (US); Senthilkumar Manickavasagam, North Easton, MA (US); Wang Chen, Brookline, MA (US); Girish Venkataramani, Boston, MA (US); Wei Zang, Framingham, MA (US); Abhijeet H. Gadkari, Natick, MA (US); Matthew H. Fornero, Oakland, CA (US)

(73) Assignee: The MathWorks, Inc., Natick, MA (US)

( * ) Notice: Subject to any disclaimer, the term of this patent is extended or adjusted under 35 U.S.C. 154(b) by 1142 days.

(21) Appl. No.: 14/559,566

(22) Filed: Dec. 3, 2014

(51) Int. Cl.
  *G06F 9/54* (2006.01)
  *G06F 17/50* (2006.01)

(52) U.S. Cl.
  CPC ............ *G06F 17/5009* (2013.01); *G06F 9/54* (2013.01)

(58) Field of Classification Search
  CPC .............................. G06F 17/5009; G06F 9/54
  See application file for complete search history.

(56) References Cited

U.S. PATENT DOCUMENTS

| | | | |
|---|---|---|---|
| 7,376,544 B1* | 5/2008 | Dick | G06F 17/5022 703/14 |
| 7,596,636 B2 | 9/2009 | Gormley | |
| 8,875,073 B1* | 10/2014 | Sundararajan | G06F 17/505 716/104 |
| 9,558,305 B1 | 1/2017 | Popovici et al. | |

(Continued)

OTHER PUBLICATIONS

Xilinix, Parameterizable LocalLink Fifo, May 10, 2007, 30 pages. (Year: 2007).*

(Continued)

*Primary Examiner* — Brian W Wathen
*Assistant Examiner* — Carina Yun
(74) *Attorney, Agent, or Firm* — Cesari and McKenna, LLP; Michael R. Reinemann

(57) ABSTRACT

A method may include receiving functional model information regarding a set of functional blocks associated with a functional model. The functional model may include a streaming algorithm for exchanging streaming data. The method may include receiving architectural model information regarding physical devices included in a target device from a hardware-software co-design platform. The physical devices may include a software based processing device and a hardware based processing device. The method may include mapping the functional blocks to the physical devices to allow the streaming data to be communicated between the software based processing device and the hardware based processing device. The method may include generating a streaming interface to model communication of the streaming data between the software based processing (Continued)

device and the hardware based processing device. The method may include generating computer code for implementing the functional model on the target device and outputting the computer code.

23 Claims, 10 Drawing Sheets

(56) References Cited

U.S. PATENT DOCUMENTS

| | | | |
|---|---|---|---|
| 2004/0010401 A1* | 1/2004 | Davis | G06F 17/5022 703/14 |
| 2006/0200795 A1 | 9/2006 | MacLay | |
| 2008/0098349 A1* | 4/2008 | Lin | G06F 8/10 717/106 |
| 2008/0313600 A1 | 12/2008 | Moore | |
| 2010/0293423 A1* | 11/2010 | Goyal | G01R 31/3177 714/726 |
| 2010/0312364 A1 | 12/2010 | Eryilmaz et al. | |

OTHER PUBLICATIONS

AXI Reference Guide, Mar. 7, 2011, 82 pages. (Year: 2011).*
Co-pending U.S. Appl. No. 13/485,839, entitled "Automatic Modeling, Mapping, and Code Generation for Homogeneous and Heterogeneous Platforms", by Katalin M. Popovici et al., filed May 31, 2012, 50 pages.
Hillenbrand, Martin, et al., "An Approach to Supply Simulations of the Functional Environment of ECUs for Hardware-In-The-Loop Test Systems Based on EE-Architectures Conform to AUTOSAR," IEEE/IFIP International Symposium on Rapid System Protyping, IEEE, Jun. 2009, pp. 188-195.

* cited by examiner

STREAMING ON HARDWARE-SOFTWARE PLATFORMS IN MODEL BASED DESIGNS

RELATED APPLICATION

This application incorporates by reference the content of U.S. patent application Ser. No. 13/485,839, filed on May 31, 2012, in its entirety.

DETAILED DESCRIPTION

The following detailed description of example implementations refers to the accompanying drawings. The same reference numbers in different drawings may identify the same or similar elements.

A system may be modeled in a technical computing environment (TCE). The system may be, for example, a distributed embedded system or a parallel computing system, which includes one or more physical devices. In a distributed embedded system, the one or more physical devices may have a defined role and may perform different tasks from other physical devices. These physical devices may include processing devices, input devices, and/or output devices. A parallel computing system may include multiple processing devices packaged as a unit in which a task may be separated into smaller tasks that can be run in parallel on the multiple processing devices.

Different types of processing devices may have their own distinct properties and be best suited for different kinds of processing. For example, field programmable gate arrays (FPGAs) may be associated with high performance and relatively low cost. As another example, processors (e.g., central processing units (CPUs)) may be associated with high flexibility and availability. Because of these various properties, different processing devices may be assigned different tasks, such as executing separate portions of a functional model. Thus, certain systems may include multiple different types of processing devices, which may each execute portions of a functional model.

However, modeling communication between FPGAs (or other hardware based processing devices) and processors (or other software based processing devices) may be difficult when the functional model includes a streaming algorithm to be simulated in a target platform environment. This difficulty may arise because of a mismatch between a vector based software processing device and a streaming based hardware processing device. Implementations described herein may use a vector based hardware/software modeling boundary (e.g., a serializer and a deserializer included in the hardware based processing device) to enable modelling of the software based processing device and the hardware based processing device together in a functional model. Implementations described herein may replace the vector based hardware/software modeling boundary with a streaming interface during code generation for implementing communication of streaming data on a hardware-software co-design platform.

Figure 1A:
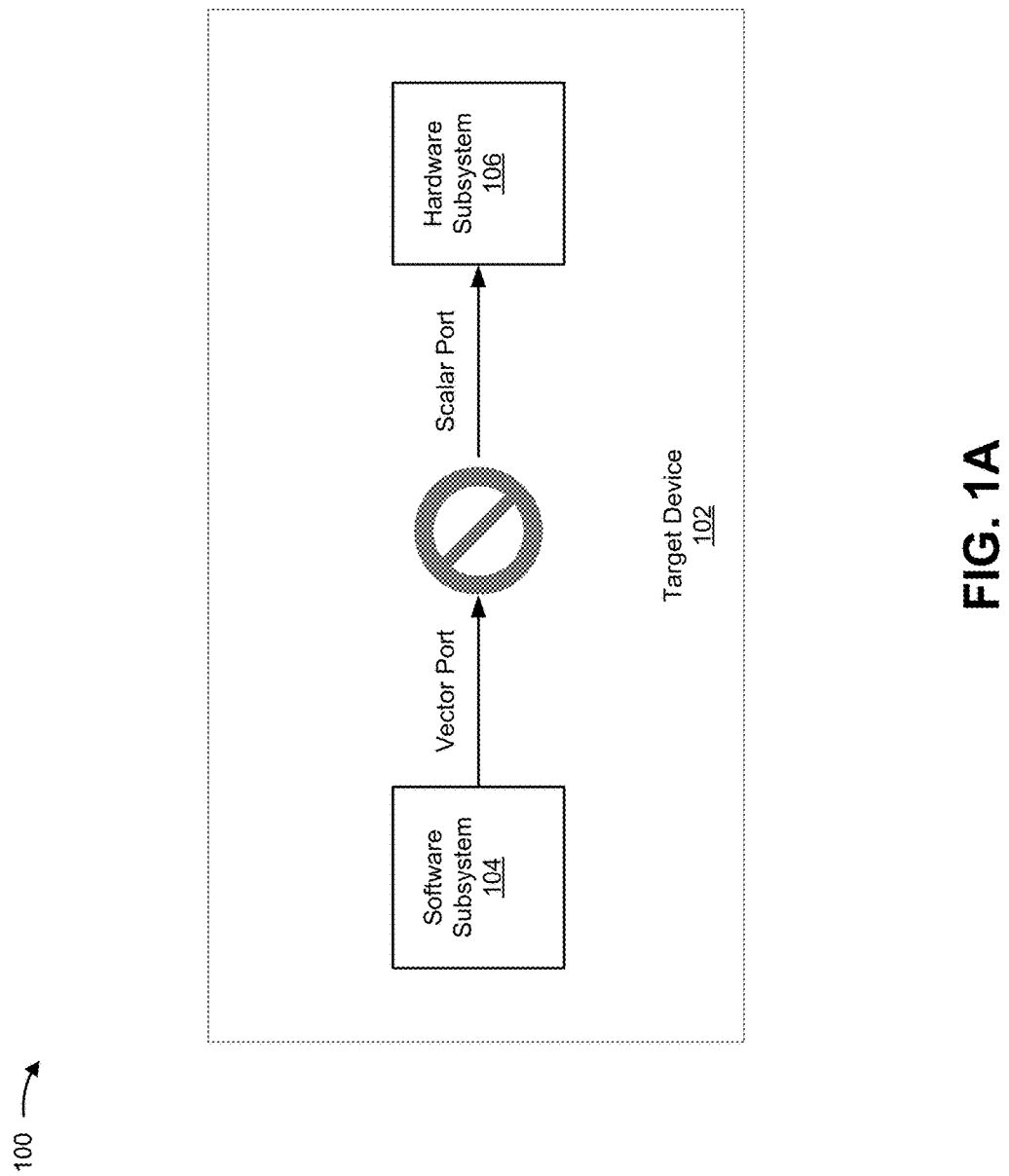
FIGS. 1A and 1B are diagrams of an overview of an example implementation described herein.
Figure 1B:
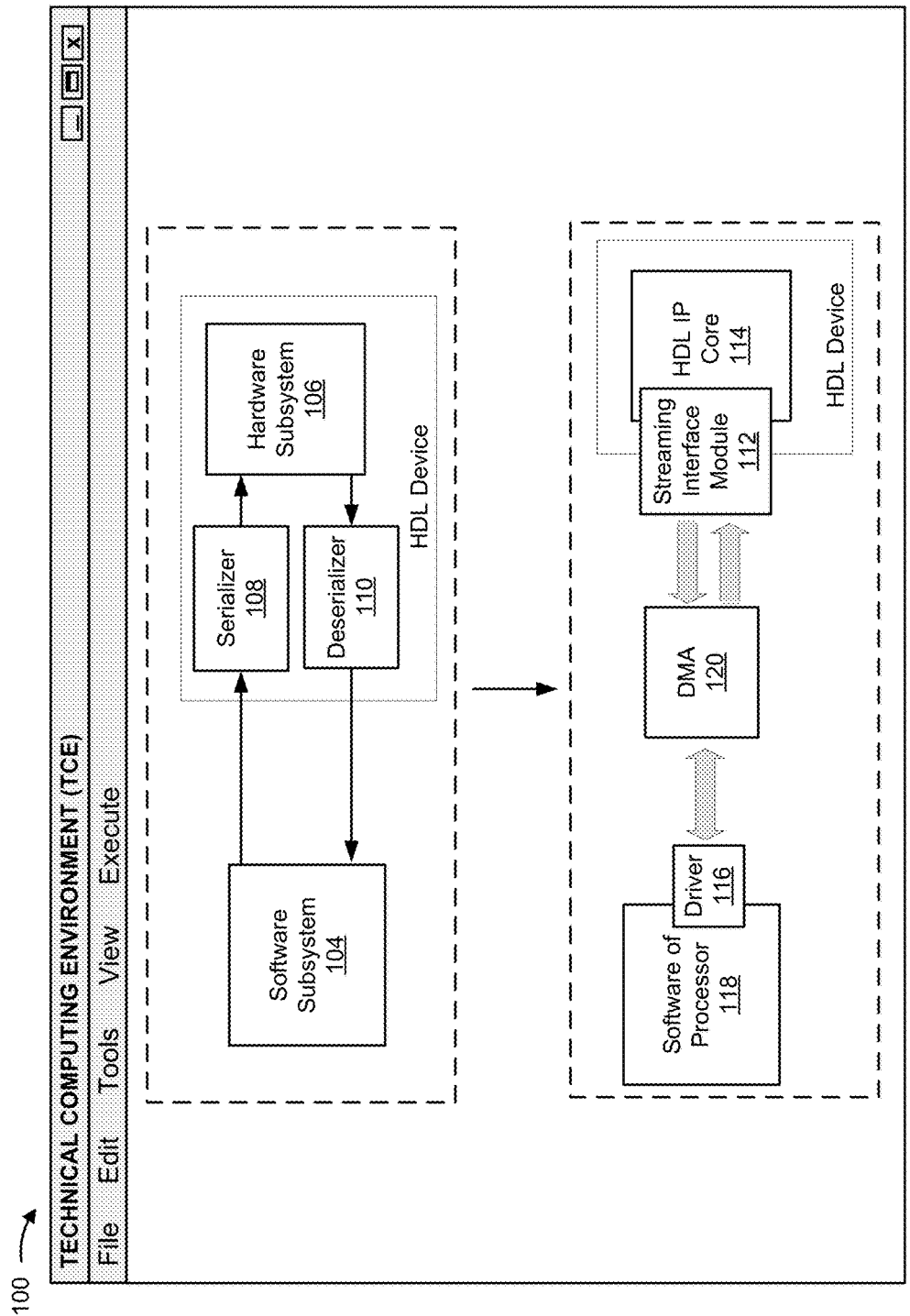

FIGS. 1A and 1B are diagrams of an overview of an example implementation 100 described herein.

As shown in FIG. 1A, a target device 102 may include a software subsystem 104 (e.g., a CPU or another software based processing device) and a hardware subsystem 106 (e.g., a FPGA or another hardware based processing device). Assume a functional model (e.g., representing an algorithm) that is to be modeled in a target platform environment uses a protocol that causes software subsystem 104 and hardware subsystem 106 to exchange streaming data (e.g., streaming video data, streaming radio frequency (RF) baseband data, or the like). For example, software subsystem 104 may transfer large amounts of data to hardware subsystem 106 in a short amount of time when target device 102 implements the streaming algorithm. However, hardware subsystem 106 may not accept streaming data with the same dimensions as streaming data output from software subsystem 104. For example, software subsystem 104 may process such streaming data using vectors, and software subsystem 104 may output vector data (e.g., data that includes vectors, arrays, multidimensional arrays, and/or matrices) via a vector port. However, the model of hardware subsystem 106 may not be able to accept the vector data and instead may accept scalar data via a scalar port when streaming data is exchanged. Accordingly, there may be a mismatch between the vector data output by software subsystem 104 and the scalar data that may be accepted by hardware subsystem 106. Likewise, there may be a mismatch between scalar data output by hardware subsystem 106 and the vector data that may be accepted by software subsystem 104. A serializer and deserializer may be used to convert vector data into scalar data in the functional model, which enables the modelling of the streaming interface between hardware subsystem 106 and software subsystem 104.

As shown in FIG. 1B, a client device may provide a TCE to a user. Assume the user uses the TCE to create the functional model that represents the algorithm to be implemented by target device 102. The functional model may include a serializer 108 and a deserializer 110 to convert the vector data and the scalar data. Further, assume the user uses the TCE to create an architectural model that represents the physical devices (e.g., software subsystem 104 and hardware subsystem 106) included in target device 102. Assume the architectural model includes a streaming interface between software subsystem 104 and hardware subsystem 106.

The client device may map the functional model to the architectural model to create an implementation model. For example, portions of the functional model may be mapped to physical devices in the architectural model that will implement the portion of the functional model. The client device may generate computer code, based on the mapping, to implement the streaming algorithm on target device 102. During the computer code generation, the client device may identify the streaming interface in the architectural model and replace serializer 108 and deserializer 110 with a streaming interface module 112 based on the identified streaming interface. In some implementations, the client device may generate a hardware design language (HDL) core 114 for the hardware subsystem that includes streaming interface module 112. The client device may also configure and instantiate a software driver 116, executed by software of processor 118 (e.g., software executed by the software subsystem), that allows the software subsystem to communicate with the HDL core via the streaming interface. A direct memory access (DMA) 120 included in the target device (as indicated by the architectural model) may be a bridge that the hardware subsystem and the software system use to communicate. For example, when generating the computer code, the client device may configure DMA 120 based on device driver libraries provided by software of processor 118.

In this way, a streaming algorithm may be modeled in the target platform environment that allows for design of a software subsystem and a hardware subsystem that exchange streaming data. Based on the modeling, the TCE may verify the computer code and provide the computer code to target device 102 so that target device 102 may execute the streaming algorithm included in the functional model.

Figure 2:
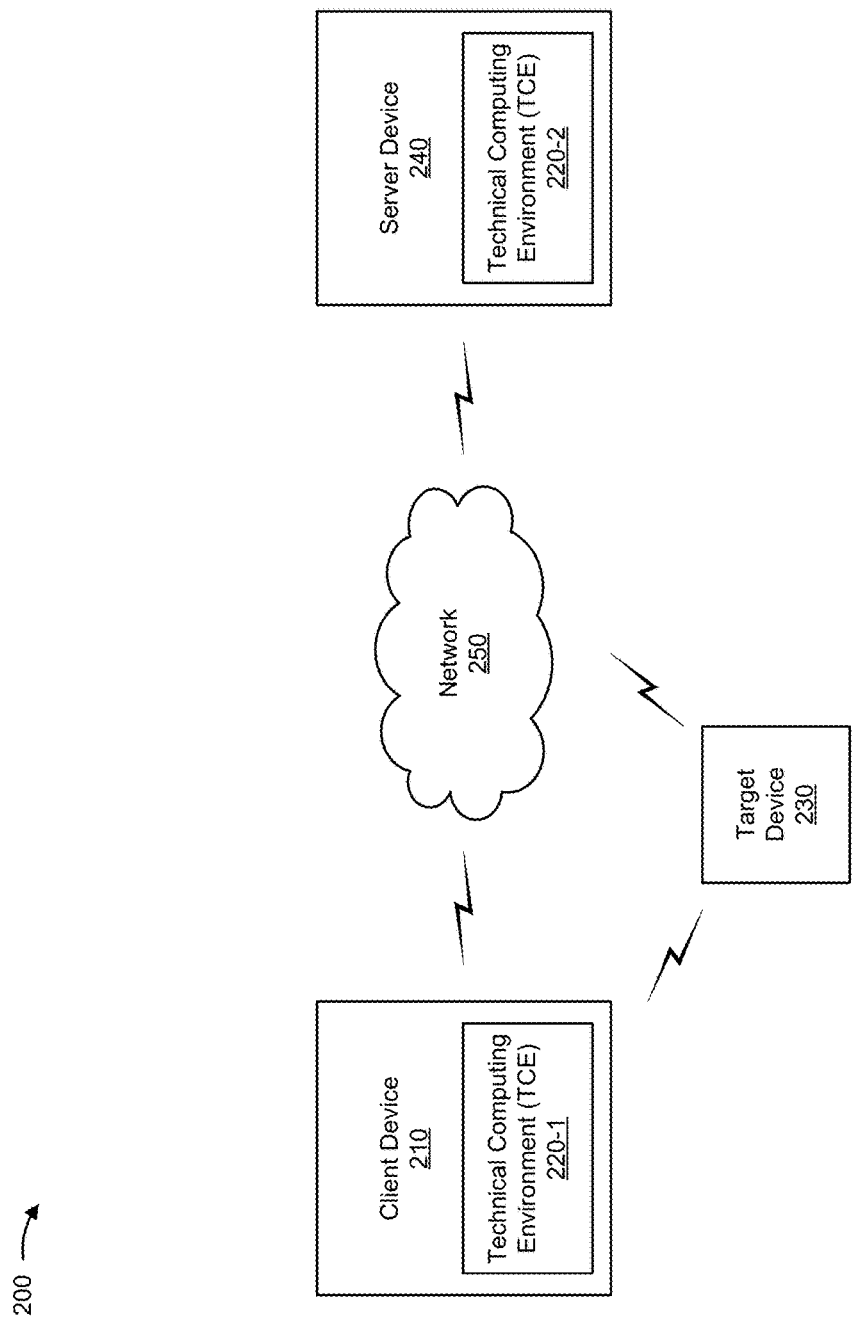
FIG. 2 is a diagram of an example environment in which systems and/or methods, described herein, may be implemented.

FIG. 2 is a diagram of an example environment 200 in which systems and/or methods, described herein, may be implemented. As shown in FIG. 2, environment 200 may include a client device 210, which may include a TCE 220 (e.g., TCE 220-1). Furthermore, environment 200 may include a target device 230, a server device 240, which may include TCE 220 (e.g., TCE 220-2), and a network 250. Devices of environment 200 may interconnect via wired connections, wireless connections, or a combination of wired and wireless connections.

Client device 210 may include one or more devices capable of receiving, generating, storing, processing, and/or providing program code and/or information associated with program code. For example, client device 210 may include a computing device, such as a desktop computer, a laptop computer, a tablet computer, a mobile phone (e.g., a smart phone, a radiotelephone, etc.), or a similar device. In some implementations, client device 210 may receive information from and/or transmit information to server device 240 and/or target device 230.

Client device 210 may host TCE 220. TCE 220 may include any hardware-based component or a combination of hardware and software-based components that provides a computing environment that allows tasks to be performed (e.g., by users) related to disciplines, such as, but not limited to, mathematics, science, engineering, medicine, and business. TCE 220 may include a text-based environment (e.g., MATLAB® software by The MathWorks, Inc.), a graphically-based environment (e.g., Simulink® software, Stateflow® software, SimEvents® software, etc., by The Math-Works, Inc.; VisSim by Visual Solutions; LabView® by National Instruments; Agilent VEE by Agilent Technologies; Advanced Design System (ADS) by Agilent Technologies; Agilent Ptolemy by Agilent Technologies; etc.), or another type of environment, such as a hybrid environment that may include, for example, a text-based environment and a graphically-based environment. In some implementations, TCE 220 may include, for example, a dynamically interactive user interface and/or may enable simulation and execution of hardware and/or software systems.

TCE 220 may include a graphical modeling environment. In some implementations, a graphical modeling environment may include a block diagram environment for modeling, simulating, and/or executing a system using a block diagram, for automatically generating code for simulating the system, for testing or verifying the system, or the like. Additionally, or alternatively, a graphical modeling environment may include a state machine environment for modeling, simulating, and/or executing decision logic using a state machine, a flow chart, or the like. The graphical modeling environment may be associated with one or more elements (e.g., entities, such as graphical entities, textual entities, programming objects, relationships between entities, ports associated with entities, attributes of entities, etc.), as described in more detail elsewhere herein. In some implementations, the elements may be executable.

For example, TCE 220 may include a modeling environment that may be used in the creation of a functional model and that may enable generation of executable code based on the model. For example, TCE 220 may include a graphical modeling tool or application that provides a user interface for a numerical computing environment. Additionally, or alternatively, TCE 220 may include a graphical modeling tool and/or application that provides a user interface for modeling and simulating (e.g., by executing a model) a dynamic system (e.g., based on differential equations, difference equations, discrete events, discrete states, etc.). Execution of a model to simulate a system may also be referred to as simulating a model. The model may further include static relations (e.g., algebraic relations, stochastic relations, inequalities, etc.).

The system represented by a model may have various execution semantics that may be represented in the model as a collection of modeling entities, sometimes referred to as blocks. A block may generally refer to a portion of functionality that may be used in the model. The block may be represented graphically, textually, and/or stored in some form of internal representation. Also, a particular visual depiction used to represent the block, for example in a graphical block diagram, may be a design choice.

A block may be hierarchical in that the block itself may include one or more blocks that make up the block. A block including one or more blocks (sub-blocks) may be referred to as a subsystem block. A subsystem block may be configured to represent a subsystem of the overall system represented by the model. A subsystem block may be a masked subsystem block that is configured to have a logical workspace that contains variables only readable and writeable by elements contained by the subsystem block.

A graphical model (e.g., a functional model) may include entities with relationships between the entities, and the relationships and/or the entities may have attributes associated with them. The entities may include, for example, blocks and/or ports. The relationships may include for example, lines (e.g., connector lines) and/or references (e.g., textual labels). The attributes may include, for example, value information and meta information for the model element associated with the attributes. A graphical model may be associated with configuration information. The configuration information may include information for the graphical model, such as model execution information (e.g., numerical integration schemes, fundamental execution period, etc.), model diagnostic information (e.g., whether an algebraic loop should be considered an error or result in a warning), model optimization information (e.g., whether model elements should share memory during execution), model processing information (e.g., whether common functionality should be shared in code that is generated for a model), etc.

In some implementations, a graphical model may have executable semantics and/or may be executable. An executable graphical model may be a time based block diagram. A time based block diagram may consist, for example, of blocks connected by lines (e.g., connector lines). The blocks may consist of elemental dynamic systems such as a differential equation system (e.g., to specify continuous-time behavior), a difference equation system (e.g., to specify discrete-time behavior), an algebraic equation system (e.g., to specify constraints), a state transition system (e.g., to specify finite state machine behavior), an event based system (e.g., to specify discrete event behavior), etc. The lines may represent signals (e.g., to specify input/output relations between blocks or to specify execution dependencies between blocks), variables (e.g., to specify information shared between blocks), physical connections (e.g., to specify electrical wires, pipes with volume flow, rigid mechanical connections, etc.), etc. The attributes may consist of meta information such as sample times, dimensions, complexity (whether there is an imaginary component to a value), data type, etc. associated with the model elements.

In a time based block diagram, ports may be associated with blocks. A relationship between two ports may be created by connecting a line (e.g., a connector line) between the two ports. Lines may also, or alternatively, be connected to other lines, for example by creating branch points. For instance, three or more ports can be connected by connecting a line to each of the ports, and by connecting each of the lines to a common branch point for all of the lines. A common branch point for the lines that represent physical connections may be a dynamic system (e.g., by summing all variables of a certain type to 0 or by equating all variables of a certain type). A port may be an input port, an output port, a non-causal port, an enable port, a trigger port, a function-call port, a publish port, a subscribe port, an exception port, an error port, a physics port, a power port, an entity flow port, a data flow port, a control flow port, etc.

Relationships between blocks may be causal and/or non-causal. For example, a model (e.g., a functional model) may include a block that represents a continuous-time integration block that may be causally related to a data logging block by using a line (e.g., a connector line) to connect an output port of the continuous-time integration block to an input port of the data logging block. Further, during execution of the model, the value stored by the continuous-time integrator may change as the current time of the execution progresses. The value of the state of the continuous-time integrator may be available on the output port and the connection with the input port of the data logging block may make this value available to the data logging block.

In one example, a block may include or otherwise correspond to a non-causal modeling function or operation. An example of a non-causal modeling function may include a function, operation, or equation that may be executed in different fashions depending on one or more inputs, circumstances, and/or conditions. Put another way, a non-causal modeling function or operation may include a function, operation, or equation that does not have a predetermined causality. For instance, a non-causal modeling function may include an equation (e.g., X=2Y) that can be used to identify the value of one variable in the equation (e.g., "X") upon receiving an assigned value corresponding to the other variable (e.g., "Y"). Similarly, if the value of the other variable (e.g., "Y") were provided, the equation could also be used to determine the value of the one variable (e.g., "X").

Assigning causality to equations may include determining which variable in an equation is computed by using that equation. Assigning causality may be performed by sorting algorithms, such as a Gaussian elimination algorithm. The result of assigning causality may be a lower block triangular matrix that represents the sorted equations with strongly connected components representative of algebraic cycles or loops. Assigning causality may be part of model compilation.

Equations may be provided in symbolic form. A set of symbolic equations may be symbolically processed to, for example, produce a simpler form. To illustrate, a system of two equations X=2Y+U and Y=3X−2U may be symbolically processed into one equation 5Y=−U. Symbolic processing of equations may be part of model compilation.

As such, a non-causal modeling function may not, for example, require a certain input or type of input (e.g., the value of a particular variable) in order to produce a valid output or otherwise operate as intended. Indeed, the operation of a non-causal modeling function may vary based on, for example, circumstance, conditions, or inputs corresponding to the non-causal modeling function. Consequently, while the description provided above generally describes a directionally specific or consistent signal flow between blocks, in other implementations, the interactions between blocks may not necessarily be directionally specific or consistent.

In some implementations, connector lines in a model may represent related variables that are shared between two connected blocks. The variables may be related such that their combination may represent power. For example, connector lines may represent voltage, current, power, etc. In some implementations, the signal flow between blocks may be automatically derived.

In some implementations, one or more blocks may also, or alternatively, operate in accordance with one or more rules or policies corresponding to a model in which they are included. For instance, if the model were intended to behave as an actual, physical system or device, such as an electronic circuit, the blocks may be required to operate within, for example, the laws of physics (also referred to herein as "physics-based rules"). These laws of physics may be formulated as differential and/or algebraic equations (e.g., constraints, etc.). The differential equations may include derivatives with respect to time, distance, and/or other quantities, and may be ordinary differential equations (ODEs), partial differential equations (PDEs), and/or differential and algebraic equations (DAEs). Requiring models and/or model components to operate in accordance with such rules or policies may, for example, help ensure that simulations based on such models will operate as intended.

A sample time may be associated with the elements of a graphical model. For example, a graphical model may include a block with a continuous sample time such as a continuous-time integration block that may integrate an input value as time of execution progresses. This integration may be specified by a differential equation. During execution, the continuous-time behavior may be approximated by a numerical integration scheme that is part of a numerical solver. The numerical solver may take discrete steps to advance the execution time, and these discrete steps may be constant during an execution (e.g., fixed step integration) or may be variable during an execution (e.g., variable-step integration).

In some implementations, a graphical model may include a block with a discrete sample time such as a unit delay block that may output values of a corresponding input after a specific delay. This delay may be a time interval and this interval may determine a sample time of the block. During execution, the unit delay block may be evaluated each time the execution time has reached a point in time where an output of the unit delay block may change. These points in time may be statically determined based on a scheduling analysis of the graphical model before starting execution.

In some implementations, a graphical model may include a block with an asynchronous sample time, such as a function-call generator block that may schedule a connected block to be evaluated at a non-periodic time. During execution, a function-call generator block may evaluate an input and when the input attains a specific value when the execution time has reached a point in time, the function-call generator block may schedule a connected block to be evaluated at this point in time and before advancing execution time.

Further, the values of attributes of a graphical model may be inferred from other elements of the graphical model or attributes of the graphical model. The inferring may be part of a model compilation. For example, the graphical model may include a block, such as a unit delay block, that may have an attribute that specifies a sample time of the block. When a graphical model has an execution attribute that specifies a fundamental execution period, the sample time of the unit delay block may be inferred from this fundamental execution period.

As another example, the graphical model may include two unit delay blocks where the output of the first of the two unit delay blocks is connected to the input of the second of the two unit delay block. The sample time of the first unit delay block may be inferred from the sample time of the second unit delay block. This inference may be performed by propagation of model element attributes such that after evaluating the sample time attribute of the second unit delay block, a graph search proceeds by evaluating the sample time attribute of the first unit delay block since it is directly connected to the second unit delay block.

The values of attributes of a graphical model may be set to characteristic settings, such as one or more inherited settings, one or more default settings, etc. For example, the data type of a variable that is associated with a block may be set to a default such as a double. Because of the default setting, an alternate data type (e.g., a single, an integer, a fixed point, etc.) may be inferred based on attributes of elements that the graphical model comprises (e.g., the data type of a variable associated with a connected block) and/or attributes of the graphical model. As another example, the sample time of a block may be set to be inherited. In case of an inherited sample time, a specific sample time may be inferred based on attributes of elements that the graphical model comprises and/or attributes of the graphical model (e.g., a fundamental execution period).

Target device 230 may communicate with client device 210 and/or network 250 and may include one or more physical devices capable of receiving, generating, storing, processing, and/or providing information describing and/or associated with target device 230. For example, target device 230 may include a system and/or subsystem, such as a computing device, a mobile phone, a smart phone, a camera, a camcorder, a microphone, a video display, a robot, or the like. Additionally, or alternatively, target device 230 may include another system and/or subsystem, such as a sensor, an actuator, a motor, an accelerometer, a gyroscope, a measurement device, an input component, an output component, a processing component, a video processor, a transmitter, or the like. Additionally, or alternatively, target device 230 may include any other device whose behavior may be controlled and/or modeled. Target device 230 may communicate with client device 210 and/or network 250 using wired and/or wireless connections. Target device 230 may be modeled using TCE 220.

Target device 230 may include one or more physical devices. A physical device, as used herein, may refer to any processing device, input/output device, and/or communication pathway. A processing device, as used herein, may refer to any hardware device that performs processing functionality. A processing device may include a processing device of any type, such as, for example, a CPU, an FPGA, an application specific integrated circuit (ASIC), a floating point unit (FPU), a graphics processing unit (GPU), a multi-core processor, a particular set of cores of a multi-core processor, an electronic control unit (ECU)—e.g., an ECU in accordance with the AUTOSAR architecture and/or any other type of ECU—a digital signal processor (DSP), a micro-controller unit, and/or any other type of processing device. An input/output device, as used herein, may refer to any hardware device that performs external communication functionality. An input/output device may include an input/output device of any type, such as, for example, an analog to digital (A/D) converter, a digital to analog (D/A) converter, a RF transceiver, Universal Serial Bus (USB), Ethernet, and/or any other type of input/output device.

Server device 240 may include one or more devices capable of receiving, generating, storing, processing, and/or providing a model and/or information associated with a model (e.g., information associated with a model element). For example, server device 240 may include a computing device, such as a server, a desktop computer, a laptop computer, a tablet computer, or a similar device. In some implementations, server device 240 may host TCE 220. In some implementations, client device 210 may be used to access one or more TCEs 220 running on one or more server devices 240. For example, multiple server devices 240 may be used to execute program code (e.g., serially or in parallel), and may provide respective results of executing the program code to client device 210.

In some implementations, client device 210 and server device 240 may be owned by different entities. For example, an end user may own client device 210, and a third party may own server device 240. In some implementations, server device 240 may include a device operating in a cloud computing environment. In this way, front-end applications (e.g., a user interface) may be separated from back-end applications (e.g., program code execution). Additionally, or alternatively, server device 240 may perform one, more, or all operations described elsewhere herein as being performed by client device 210.

Network 250 may include one or more wired and/or wireless networks. For example, network 250 may include a cellular network, a public land mobile network (PLMN), a local area network (LAN), a wide area network (WAN), a metropolitan area network (MAN), a telephone network (e.g., the Public Switched Telephone Network (PSTN)), an ad hoc network, an intranet, the Internet, a fiber optic-based network, a private network, a cloud computing network, and/or a combination of these or other types of networks.

The number and arrangement of devices and networks shown in FIG. 2 are provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of environment 200 may perform one or more functions described as being performed by another set of devices of environment 200.

Figure 3:
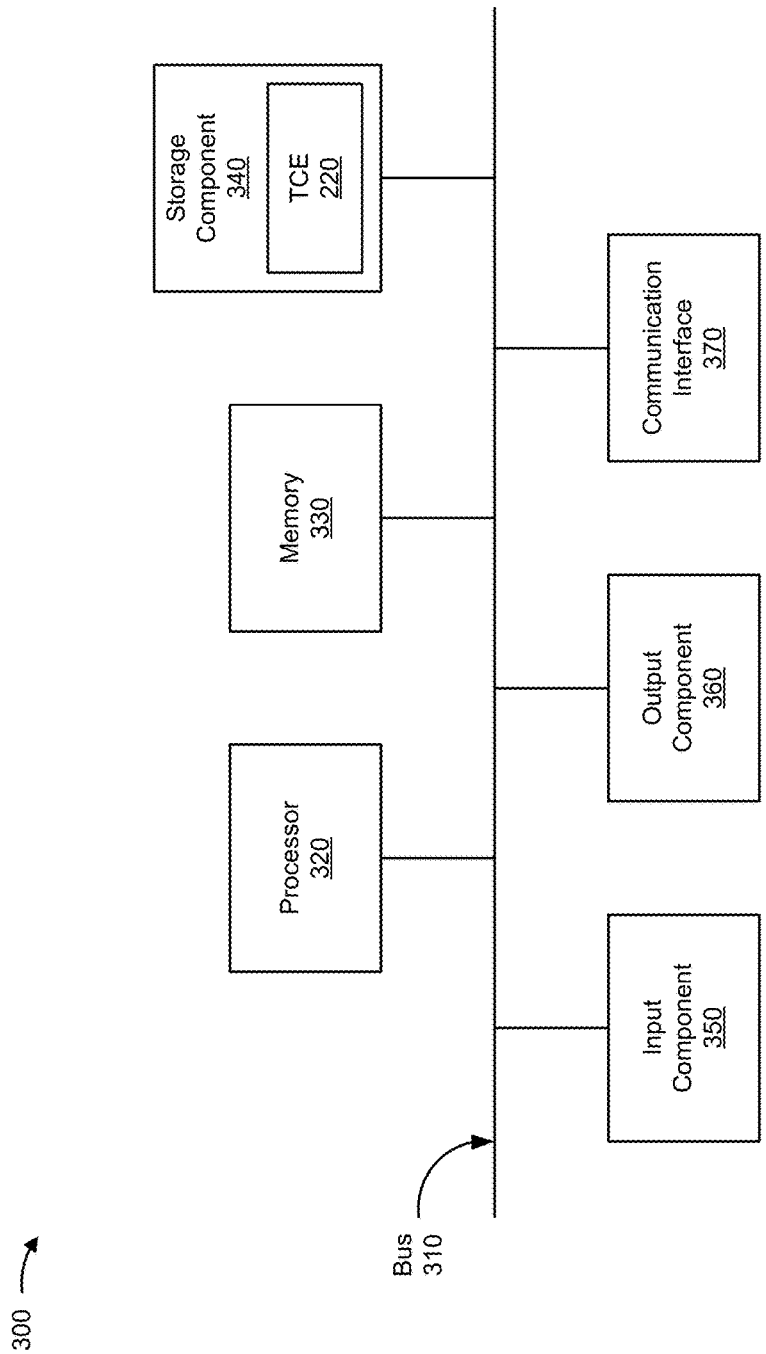
FIG. 3 is a diagram of example components of one or more devices of FIG. 2.

FIG. 3 is a diagram of example components of a device 300. Device 300 may correspond to client device 210, target device 230, and/or server device 240. In some implementations, client device 210, target device 230, and/or server device 240 may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 may include a component that permits communication among the components of device 300. Processor 320 may include a processor (e.g., a central processing unit (CPU), a graphics processing unit (GPU), an accelerated processing unit (APU), etc.), a microprocessor, and/or any processing component (e.g., a FPGA, an application-specific integrated circuit (ASIC), etc.) that interprets and/or executes instructions, and/or that is designed to implement one or more computing tasks. In some implementations, processor 320 may include multiple processor cores for parallel computing. Memory 330 may include a random access memory (RAM), a read only memory (ROM), and/or another type of dynamic or static storage device (e.g., a flash memory, a magnetic memory, an optical memory, etc.) that stores information and/or instructions for use by processor 320.

Storage component 340 may store information and/or software related to the operation and use of device 300. For example, storage component 340 may include a hard disk (e.g., a magnetic disk, an optical disk, a magneto-optic disk, a solid state disk, etc.), a compact disc (CD), a digital versatile disc (DVD), a floppy disk, a cartridge, a magnetic tape, and/or another type of computer-readable medium, along with a corresponding drive. In some implementations, storage component 340 may store TCE 220.

Input component 350 may include a component that permits device 300 to receive information, such as via user input (e.g., a touch screen display, a keyboard, a keypad, a mouse, a button, a switch, a microphone, etc.). Additionally, or alternatively, input component 350 may include a sensor for sensing information (e.g., a global positioning system (GPS) component, an accelerometer, a gyroscope, an actuator, etc.). Output component 360 may include a component that provides output information from device 300 (e.g., a display, a speaker, one or more light-emitting diodes (LEDs), etc.).

Communication interface 370 may include a transceiver-like component (e.g., a transceiver, a separate receiver and transmitter, etc.) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, a RF interface, a universal serial bus (USB) interface, a Wi-Fi interface, a cellular network interface, or the like.

Device 300 may perform one or more processes described herein. Device 300 may perform these processes in response to processor 320 executing software instructions stored by a computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

FIGS. 4A-4E are diagrams of an example implementation 400 for implementing a model of a streaming algorithm on a hardware-software co-design platform.

Figure 4A:
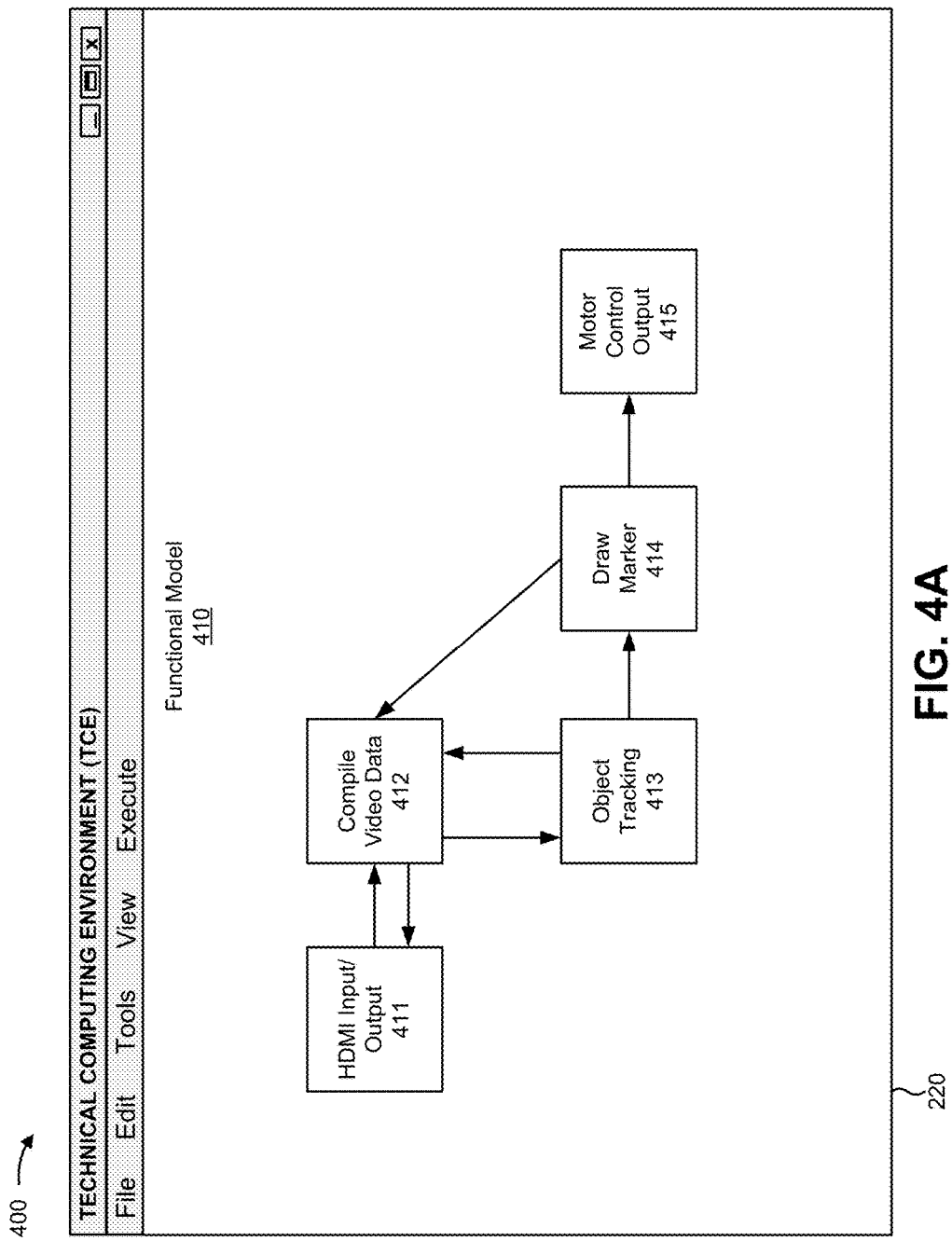
FIGS. 4A-4E are diagrams of an example implementation for implementing a model of a streaming algorithm on a hardware-software co-design platform.

In FIG. 4A, assume client device 210 presents TCE 220 to a user. The user may use TCE 220 to generate a functional model 410. For example, client device 210 may provide a graphical interface through which the user can arrange graphical blocks that represent functionality and/or data. Functional model 410 may be an algorithm for receiving video data (e.g., High-Definition Multimedia Interface (HDMI) data), tracking an object in the video data, drawing a marker in the video data that follows the object when the video data is displayed, outputting the video data with the marker, and controlling a motor of an image capture device to move the image capture device to follow the object. Functional model 410 may use a vector based hardware/software modeling boundary (e.g., a serializer and a deserializer) to enable modelling of the algorithm on a software based processing device and a hardware based processing device.

For example, as shown in FIG. 4A, functional model 410 may include a HDMI input/output block 411 that includes an algorithm for receiving an input of HDMI data and outputting HDMI data. Functional model 410 may further include a compile video data block 412 that includes an algorithm for storing and/or accessing the HDMI data. HDMI input/output block 411 may provide the HDMI data to compile video data block 412 in a streaming manner. Functional model 410 may include an object tracking block 413 that includes an algorithm for identifying and tracking the object in the HDMI data. Object tracking block 413 and compile video data block 412 may exchange data in a streaming manner so that object tracking block 413 can process the HDMI data in real time or near real time. Functional model 410 may include a draw marker block 414 that includes an algorithm for drawing a marker on the object in the HDMI data. Object tracking block 413 may output coordinates of the object to draw marker block 414 that draw marker block 414 uses to draw the marker. Draw marker block 414 may output the marker to compile video data block 412 to be included in the HDMI data that may be output for display by HDMI input/output block 411. Draw marker block 414 may also include an algorithm to calculate the desired position of the object within the HDMI data (e.g., a position within a frame of the HDMI data), and output desired position information to a motor control output block 415. Motor control output block 415 may include an algorithm for controlling a motor to move the image capture device that collects the HDMI data so that the object stays in a frame of the collected HDMI data. Motor control output block 415 may send instructions to the motor to control the movement of the image capture device.

Figure 4B:
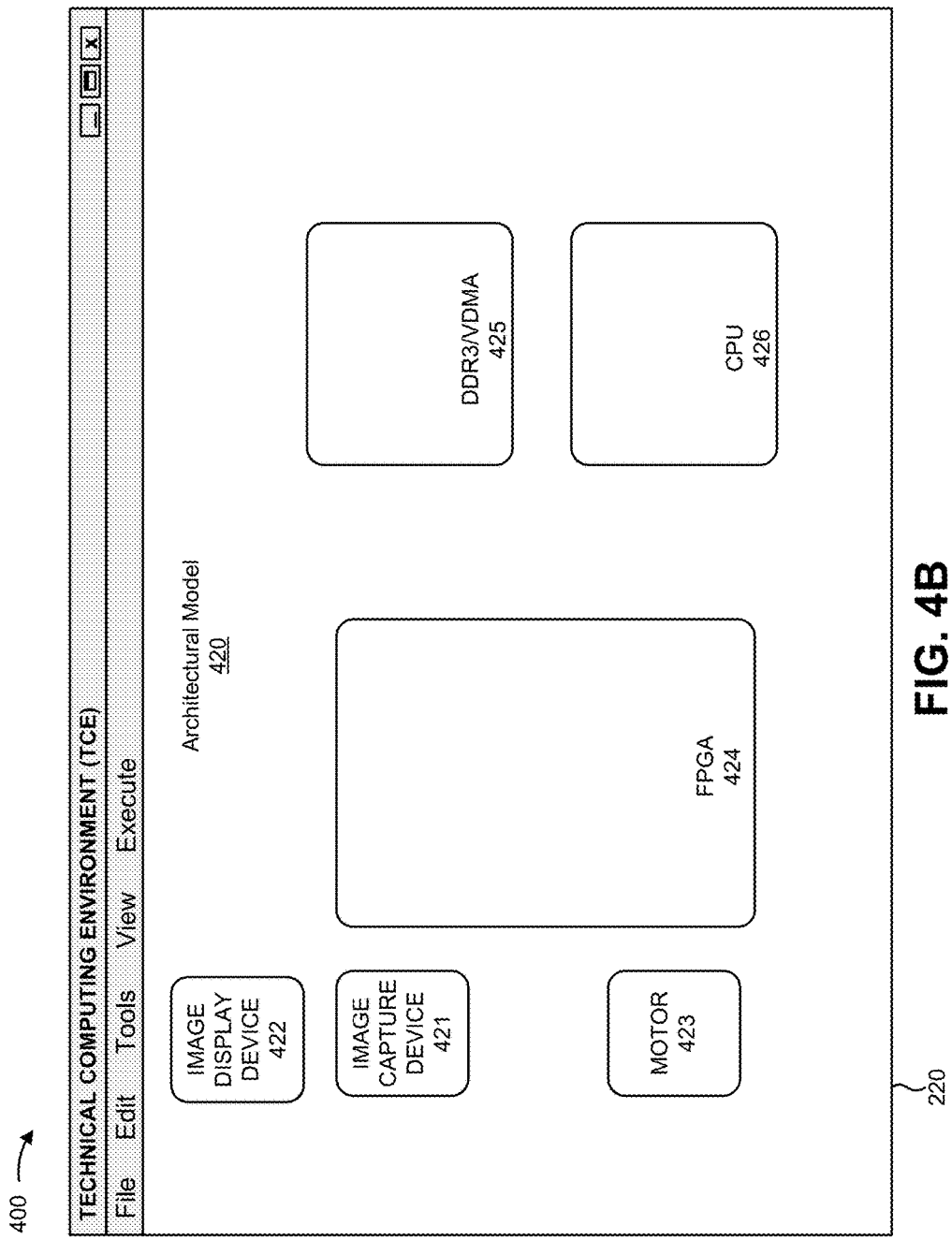

In FIG. 4B, assume the user uses TCE 220 to generate an architectural model 420 for a video camera (e.g., target device 230). For example, client device 210 may provide a graphical interface through which the user can arrange graphical blocks that represent physical devices within the video camera. The video camera may be the device on which the user desires to model simulation of the functional model and create code that will execute the functional model on the video camera.

As shown in FIG. 4B, architectural model 420 may include an image capture device block 421 that represents an image capture device (e.g., a camera), an image display device block 422 that represents an image display device that displays images and/or videos, a motor block 423 that represents a motor that controls an angle, a direction, a zoom, or the like of the image capture device, a FPGA block 424 that represents an FPGA (e.g., a hardware based processing device), a DDR3/VDMA block 425 that represents a double data rate type three synchronous dynamic random-access memory/video direct memory access (DDR3/VDMA) memory device, and a CPU block 426 that represents a CPU. The DDR3/VDMA and the CPU may represent a software based processing system.

Figure 4C:
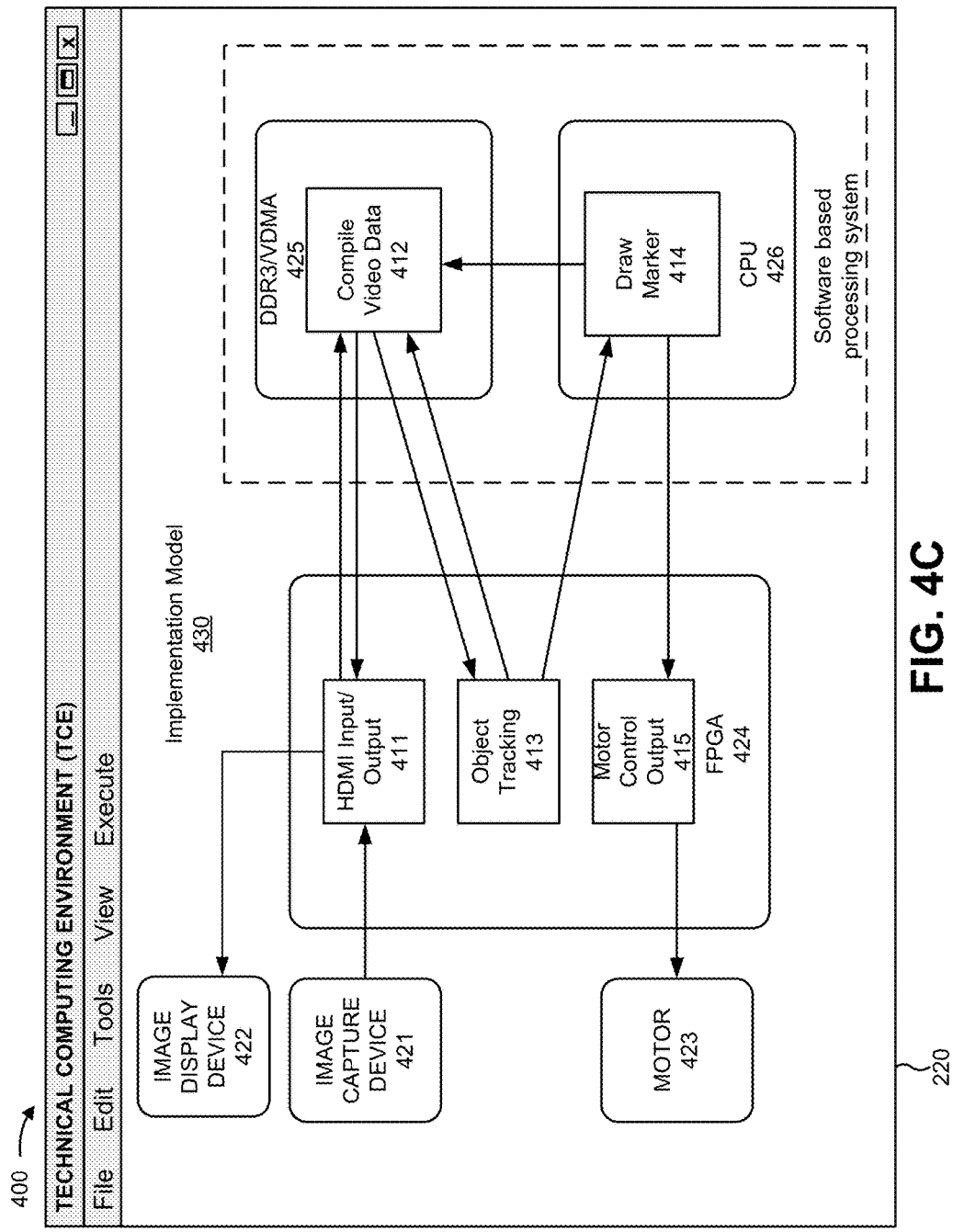

As shown in FIG. 4C, client device 210 may create an implementation model 430 by mapping functional model 410 to the architectural model 420. For example, the mapping may involve assigning functional blocks in functional model 410 to the processing devices represented by the blocks in architectural model 420.

As shown in FIG. 4C, client device 210 may map HDMI input/output block 411, object tracking block 413, and motor control output block 415 to FPGA 424 included in the video camera. Client device 210 may map compile video data block 412 to DDR3/VDMA 425 and draw marker block 414 to CPU 426.

Because of the mapping, implementation model 430 may be functionally different than functional model 410 on the interface data transfer. For example, a latency of the transfer of data may differ between functional model 410 and implementation model 430.

Furthermore, streaming HDMI data may be exchanged between FPGA 424 (hardware based processing device) and DDR3/VDMA 425/CPU 426 (software based processing system) in implementation model 430 due to the mapping. For example, HDMI data may be exchanged between FPGA 424 and the DDR3/VDMA 425. The exchange of streaming HDMI data may be modeled on the video camera by generating a streaming interface, such as an AXI4-Stream (AXI4-S) interface, that replaces the vector based hardware/software modeling boundary (e.g., the serializer and the deserializer) included in the functional model.

Figure 4D:
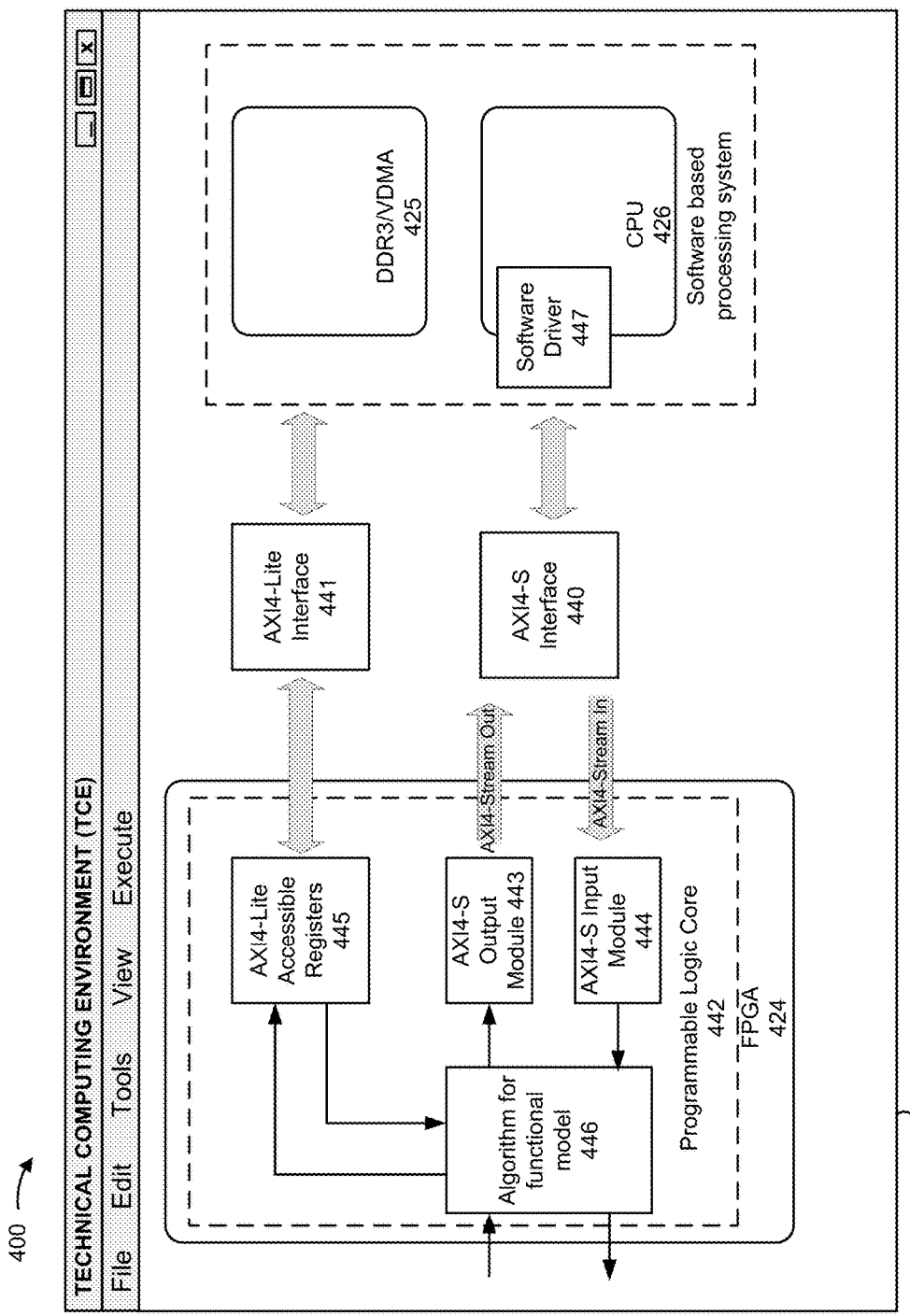

As shown in FIG. 4D, client device 210 may generate an AXI4-S interface 440 for exchanging streaming data between FPGA 424 and the software based processing system. Another interface (e.g., an AXI4-Lite interface 441) may also be generated to exchange data, other than streaming data, between FPGA 424 and the software based processing system.

As further shown in FIG. 4D, client device 210 may generate a programmable logic core 442 (e.g., one or more HDL cores) that permits FPGA 424 to communicate with AXI4-S interface 440 and/or AXI4-Lite interface 441. Programmable logic core 442 may include an AXI4-S output module 443 for outputting an AXI4-stream of data from FPGA 424, an AXI4-S input module 444 for inputting an AXI4-stream of data into the FPGA, AXI4-Lite accessible registers 445 to communicate data via AXI4-Lite interface 441, and/or an algorithm block 446 for functional model 410 that will process the AXI4-streams of data and/or other data.

Client device 210 may also generate a software driver block 447 that represents a software driver that allows the software based processing system (e.g., CPU 426 and/or DDR3/VDMA 425) to communicate with AXI4-S interface 440 so that the software based processing system may exchange streaming data via AXI4-S interface 440. Software driver block 447 may be responsible for configuring and instantiating the appropriate software driver in target device 230. For example, client device 210 may generate the software driver represented by software driver block 447 based on an address of programmable logic core 442, an interrupt number of programmable logic core 442, an address of a shared memory region, an interrupt number of the shared memory region, dimensions of a streaming vector interface port, a data-type of the streaming vector interface port, and/or a sample time of the streaming vector interface port.

Client device 210 may generate computer code for the video camera (e.g., target device 230) to execute the algorithm for receiving the video input (e.g., HDMI data), tracking the object in the video data, drawing the marker in the video data that follows the object when the video data is displayed, and controlling the motor of the video camera to move the image capture device to follow the object based on generating functional model 410, implementation model 430, the streaming interface (e.g., AXI4-S interface 440), AXI4-Lite interface 441, programmable logic core 442 (e.g., the HDL core), and/or software driver block 447.

Figure 4E:
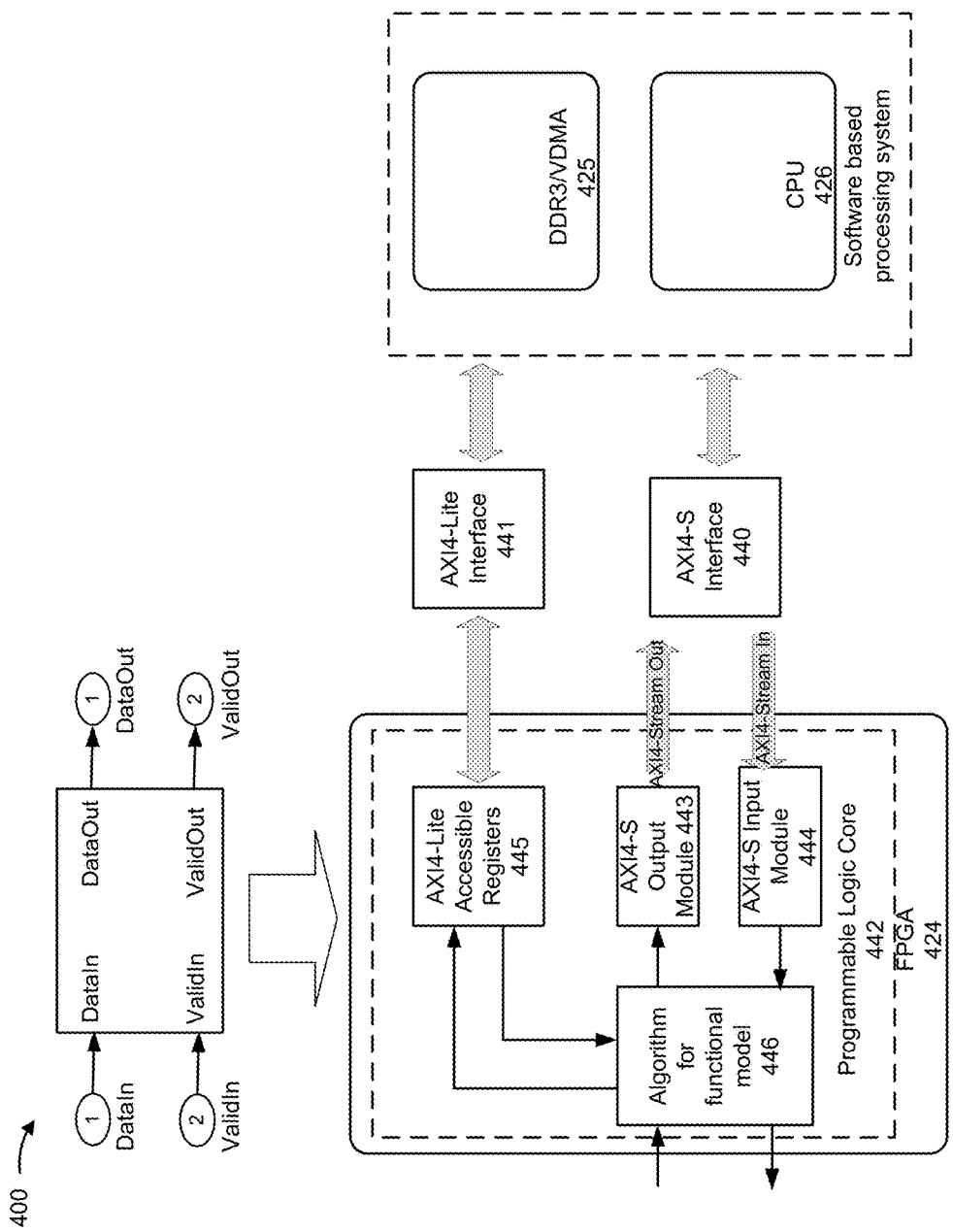

As shown in FIG. 4E, client device 210 may verify that the generated computer code will properly cause the video camera to execute the algorithm. For example, client device 210 may simulate the execution of the algorithm on the video camera based on functional model 410, implementation model 430, the streaming interface (e.g., AXI4-S interface 440), AXI4-Lite interface 441, programmable logic core 442 (e.g., the HDL core), and/or software driver block 447.

In some implementations, client device 210 may verify the computer code at different levels. For example, client device 210 may verify the code at a functional model level by simulating only the code for functional model 410 by inputting HDMI data into the code generated for functional model 410. Client device 210 may verify that the proper mark is drawn in the HDMI data where the object is located and that proper instructions to control a motor are output. Client device 210 may verify the code at the functional model level independent of the video camera (e.g., target device 230) that is to perform the code. For example, client device 210 may verify the code at the functional model level independent of architectural model 420 and/or implementation model 430.

In some implementations, client device 210 may verify the computer code at an implementation model level. For example, client device 210 may verify that the code generated for the streaming interface, the software driver, and the HDL core, works properly by simulating the code using bus function models that model one or more busses that connect FPGA 424 with the software based processing system.

Client device 210 may verify that streaming data may be properly communicated between the HDL core and the software processing system via the simulation. In some implementations, verifying the computer code at an implementation model level may be done independent of code generated for functional model 410.

In some implementations, client device 210 may verify the computer code at a board level. In other words, client device 210 may verify that the entire code works together properly by simulating execution of the code on the video camera. Client device 210 may use any type of simulation technique, such as real-time simulation (e.g., hardware in the loop) and/or non-real-time simulation techniques (e.g., software in the loop, processor in the loop, interpretive, accelerated simulation through code generation (e.g., through partial code generation), multi-core accelerated simulation, distributed simulation, etc.), to simulate the execution of the computer code on the target hardware (e.g., the video camera). Client device 210 may use an external mode simulation technique to verify the computer code on the target hardware in which client device 210 connects with the target hardware to execute the computer code on the target hardware. In the external mode, client device 210 may monitor the execution of the computer code on the target hardware (e.g., observe the output of the computer code on the target hardware and/or retrieve data from the target hardware based on executing the computer code). Client device 210 may verify and/or modify the computer code based on monitoring the execution of the computer code on the target hardware.

After verification is complete, client device 210 may output the computer code to the video camera for the video camera to execute. The video camera may receive the computer code and execute the computer code to perform the algorithm indicated by functional model 410.

As indicated above, FIGS. 4A-4E are provided merely as an example. Other examples are possible and may differ from what was described with regard to FIGS. 4A-4E.

Figure 5:
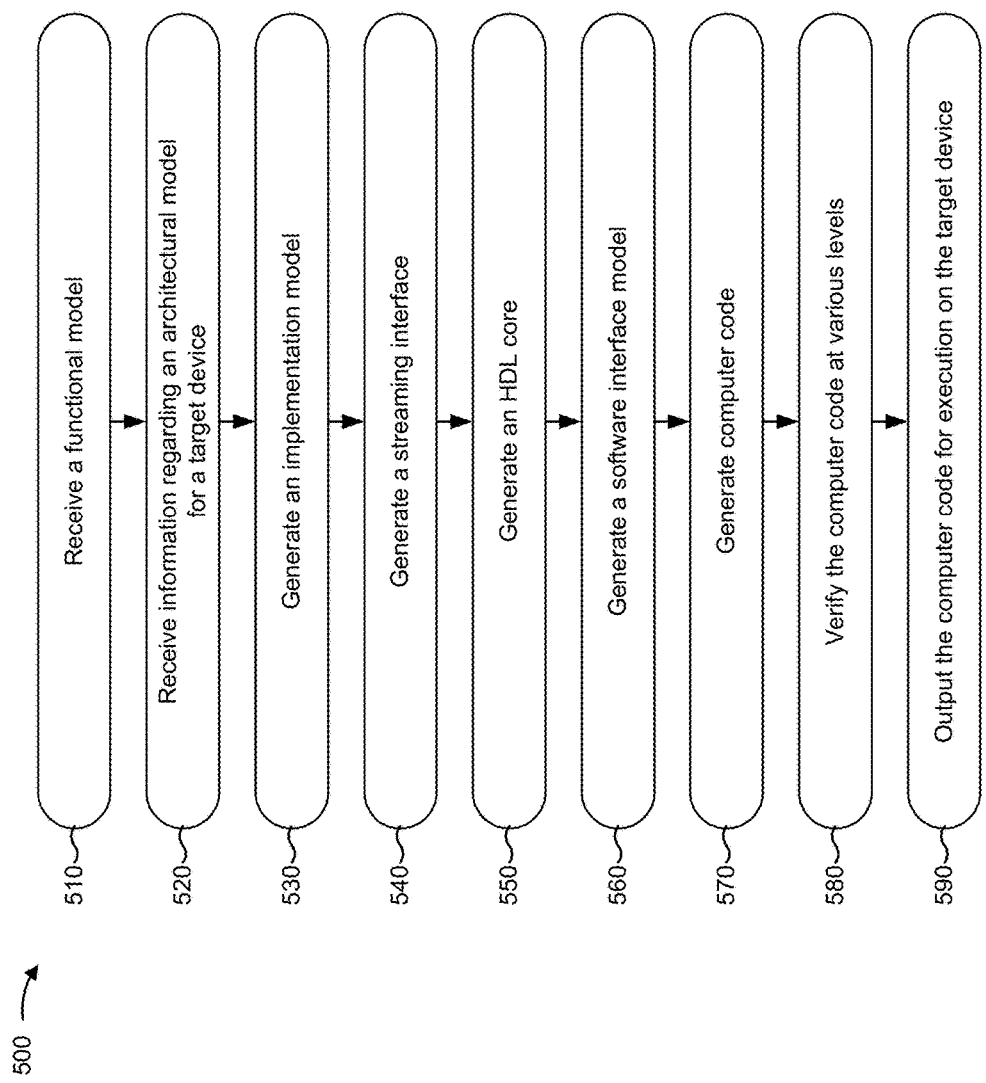
FIG. 5 is a flow chart of an example process for implementing a model of a streaming algorithm on a hardware-software co-design platform.

FIG. 5 is a flow chart of an example process 500 for implementing a model of a streaming algorithm on a hardware-software co-design platform. In some implementations, one or more process blocks of FIG. 5 may be performed by client device 210. In some implementations, one or more process blocks of FIG. 5 may be performed by another device or a group of devices separate from or including client device 210, such as target device 230 and/or server device 240.

As shown in FIG. 5, process 500 may include receiving a functional model including a streaming algorithm (block 510). For example, client device 210 may receive a functional model using TCE 220.

A functional model may refer to a model that implements algorithmic elements specified by, for example, a user. In some implementations, the functional model may be created without regard to implementation details of the physical system (e.g., target device 230) that is to implement the model. However, in some implementations, the functional model may be created based on the implementation details of the physical system. A functional model may include, for example, any equations, assignments, constraints, computations, algorithms, and/or process flows. The functional model may be implemented as, for example, time-based block diagrams (e.g., via the Simulink® product, available from The MathWorks, Incorporated), discrete-event based diagrams (e.g., via the SimEvents® product, available from The MathWorks, Incorporated), dataflow diagrams, state transition diagram (e.g., via the Stateflow® product, available from The MathWorks, Incorporated), software diagrams, a textual array-based and/or dynamically typed language (e.g., via the MATLAB® product, available from The MathWorks, Incorporated), and/or any other type of functional model.

In some implementations, client device 210 may provide one or more graphical interfaces through which a user can arrange graphical blocks that represent functionality and/or data. A graphical block may itself be defined using one or more graphical blocks to create model sub-systems. At some level of the hierarchical structuring of sub-system blocks, blocks may be defined via computer code. A user of client device 210 may obtain blocks that define different functions by using, for example, blocks written by a manufacturer of TCE 220, from third parties, or by defining their own custom blocks. The user of client device 210 may arrange the blocks and define connections between the blocks to generate the functional model.

In some implementations, the functional model may include a streaming algorithm for processing and/or exchanging streaming data (e.g., streaming video data or another kind of data). For example, the functional model may include one or more blocks that are associated with a streaming algorithm where data is exchanged and/or processed in a streaming manner. The functional model may model the streaming algorithm using a vector based hardware/software modeling boundary.

As further shown in FIG. 5, process 500 may include receiving an architectural model for target device 230 associated with a hardware-software co-design platform (block 520). For example, client device 210 may receive the architectural model using TCE 220.

In some implementations, client device 210 may receive the architectural model and/or information regarding the architectural model in the form of one or more files and/or via some other technique regarding target device 230. Additionally, or alternatively, client device 210 may provide one or more graphical interfaces, via TCE 220, through which a user may input the information by arranging graphical blocks that represent functionality of target device 230 on which a functional model is to be deployed.

The architectural model may identify, for example, one or more types of processing devices associated with target device 230. These types of devices may include, for example, CPUs, GPUs, FPUs, FPGAs, ASICs, ECUs, multi-core processors, particular cores or sets of cores of multi-core processors, and/or any other type of processing device. The architectural model may include, in some implementations, information identifying properties associated with the processing devices. These properties may include, for example, clock speed information, scheduler type information, information relating types of connections between processing devices, throughput capability information, processing capability information, and/or any other type of properties.

The architectural model may identify, for example, one or more types of input/output devices included in target device 230. Input/output devices may include, for example, A/D, D/A, RF transceiver, USB, Ethernet and/or any other type of input/output device. The architectural model may include, in some implementations, information identifying properties associated with the input/output devices. These properties may include, for example, throughput capability information, data processing capability information, and/or any other type of properties.

The architectural model may, in some implementations, include device driver information associated with the processing devices. The device driver information may include, for instance, code, references to code, one or more libraries, and/or references to one or more libraries. The device driver information for a particular processing device may, for example, be based on the type of processing device and a code language that may be associated with a functional model that may be mapped to the processing device. For example, device driver information for a particular CPU may include information regarding one device driver for the particular CPU and the C programming language, and another device driver for the particular CPU and the Java programming language. The device driver information may, in some implementations, specify how to include device driver code into code that is generated based on the functional model and the architectural model (e.g., the information may specify points in the generated code at which to insert the device driver code). Additionally, or alternatively, the device driver information may include parameters to configure the software driver and instantiate the appropriate driver. The architectural model may, in some implementations, include information regarding one or more communication channels (e.g., one or more physical uni-directional or bi-directional connections) between processing devices in target device 230. The architectural model may, in some implementations, include ECU information, such as, for example, received from an AUTOSAR ECU Extract.

In some implementations, the architectural model may be generated based on a hardware-software co-design platform that allows for design of an architectural model that includes at least one software based processing device (e.g., a CPU, a GPU, or the like) and at least one hardware based processing (e.g., a FPGA, a ASIC, or the like) in target device 230. For example, a hardware-software co-design platform may include platforms such as Zynq, Altera System on a Chip (SoC), Simulink Real-Time FPGA, or the like that may be used to generate the architectural model. In some implementations, the architectural model may identify a streaming interface that that is used to exchange data between the software based processing device and the hardware based processing device.

In some implementations, client device 210 may generate the architectural model based on the information received regarding the architectural model. The architectural model may describe capabilities of target device 230, such as its computational resources, including, for instance, types of processing and/or input/output devices in the system, driver information associated with the processing devices in the system, performance information associated with the processing devices and/or communication pathways in the system, a quantity of processing and/or input/output devices, a quantity of communication pathways in the system, and/or any other information associated with the architectural model. The architectural model may, in some implementations, indicate memory resources and additional physical devices for which the functional model will be implemented.

In some implementations, the architectural model may include blocks representing at least one software based processing device and at least one hardware based processing device. A software based processing device may execute software and/or be used for general purpose processing (e.g., a CPU or the like). A hardware based processing device may be customized for a particular processing (e.g., a FPGA, an ASIC, or the like). In some implementations, the architectural model may include blocks representing a streaming interface.

In some implementations, client device 210 may provide, for display, some or all of the architectural model. For instance, client device 210 may provide for display, via TCE 220, information identifying processing devices specified in the architectural model, properties of the processing devices, etc. In some implementations, client device 210 may allow for manipulation of some or all of the received information via TCE 220. For example, client device 210 may allow a user to add, remove, or modify processing devices from the architectural model. Additionally, or alternatively, client device 210 may allow a user to add, remove, or modify properties associated with processing devices specified by the architectural model. Client device 210 may store version information associated with such changes, so a user may view different versions of the architectural model, and may quickly see the differences between different versions of the architectural model.

As further shown in FIG. 5, process 500 may include generating an implementation model based on the functional model and the architectural model (block 530). For example, client device 210 may generate the implementation model by mapping the functional model to the architectural model.

Mapping the functional model to the architectural model may involve assigning functional units (e.g., blocks) in the functional model to the processing devices and/or the communication channel in the architectural model. In some implementations, the mapping of the functional model to the architectural model may be performed automatically by client device 210 via TCE 220 or semi-automatically in which the user may guide TCE 220 in mapping the functional units to the architectural model.

When automatically or semi-automatically mapping the functional model to the architectural model, client device 210 may use algorithmic blocks of the processing devices and communication channel(s) to optimize assignment of functional units to processing devices. For example, if a communication channel has a low bandwidth, functional blocks that have a high inter-block data connection may tend to be mapped to the same processing devices. In some implementations, the mapping may be performed manually, in which, for example, a user may map functional units to processing devices in the architectural model.

In some implementations, client device 210 may output one or more visual representations of the implementation model generated by mapping the functional model to the architectural model. One particular visual representation may be block-centric (e.g., the blocks of the functional model may be displayed, with annotations indicating hardware to which the blocks are mapped), while another particular visual representation may be architecture-centric (e.g., representations of the hardware may be displayed, with annotations indicating blocks of the functional model that are mapped to the hardware). In some implementations, client device 210 may provide for display of one of these representations, while in some implementations, client device 210 may provide for display of both of these representations simultaneously.

As further shown in FIG. 5, process 500 may include generating a streaming interface between the software based processing device and the hardware based processing device (block 540). For example, client device 210 may generate the streaming interface using TCE 220.

In some implementations, the functional model may be mapped to the architectural model in the implementation model in such a way that streaming data may be exchanged between the software based processing device (e.g., a CPU or the like) and the hardware based processing device (e.g., a FPGA, an ASIC, or the like). For example, the streaming data may be exchanged via the serializer and deserializer in the hardware subsystem, which may represent a vector based hardware/software modeling boundary. Accordingly, the serializer and deserializer may be automatically replaced with a streaming interface code during code generation.

The streaming interface may include AXI4-Stream, AXI4-Stream for video, Peripheral Component Interconnect Direct Memory Access (PCI DMA) streaming, Altera Avalon-Stream, or the like. In some implementations, client device 210 may provide a graphical user interface, via TCE 220, for the user to select a type of streaming interface to generate for one or more ports of the hardware based processing device and/or the software based processing device. The graphical user interface may also allow the user to select a type of non-streaming interface for a port. For example, the graphical user interface may present port information, such as a port name, a port type (e.g., inport or outport), a data type for the port (e.g., Boolean, uint8, uint32, or the like), a bit range of the port, an address of the port, or the like. Based on the port information, the user may select an interface for the port (e.g. a type of streaming interface or a type of non-streaming interface). In some implementations, client device 210 may determine which interfaces target device 230 supports based on the architectural model and provide information indicating the interfaces, via the graphical user interface, from which the user may select an interface. Additionally, or alternatively, client device 210 may automatically select a type of streaming interface based on the architectural model and based on the inclusion of the streaming algorithm in the functional model. For example, the architectural model may indicate a type of streaming interface included in target device 230 for which client device 210 should generate the streaming interface code. Additionally, or alternatively, client device 210 may automatically select a type of interface for a port based on port information associated with the port, such as a port name, a port type (e.g., inport or outport), a data type for the port (e.g., Boolean, uint8, uint32, or the like), a bit range of the port, an address of the port, or the like. For example, a port may have a port name of Video_in, a port type of inport, a data type of uint32, and a bit range for video data. Accordingly, client device 210 may select an AXI4-S Video In interface for the port based on the port name, the port type being an inport, the data type being uint32, and/or the bit range being for video data. As another example, a port may have a port name of Threshold, a port type of inport, and a data type of uint8. Accordingly, client device 210 may select an AXI4-Lite interface for the port based on the port name, the port type of inport, and/or the data type of uint8. Additionally, or alternatively, client device 210 may automatically select an interface based on which interfaces are supported by target device 230.

Although process 500 is primarily described with respect to a streaming interface being generated between a hardware based processing device and a software based processing device, process 500 may also apply to a case where streaming data is exchanged between two hardware based processing devices. For example, process 500 may be applied to generating a streaming interface between two hardware based processing devices.

As further shown in FIG. 5, process 500 may include generating a HDL core for communicating with the streaming interface (block 550). For example, client device 210 may automatically generate the HDL core using TCE 220.

The HDL core may include code for the hardware based processing device to communicate with the streaming interface. For example, the HDL core may include code for a streaming interface module that models input and/or output ports that exchange data with the streaming interface and/or other kinds of interfaces. In some implementations, the HDL core may include code for an algorithm that represents processing performed by the hardware based processing device.

Client device 210 may generate the HDL core based on the type of streaming interface generated and/or the architectural model (e.g., information relating to the hardware based processing device). Client device 210 may include the HDL core in a system integration tool project (e.g., Vivado tool project). A system integration tool project may describe the detailed hardware architecture of target device 230 (e.g., a system on a chip (SOC)). For example, client device 210 may insert the HDL core into the system integration tool project and connect the system integration tool project to a CPU included in target device 230.

As further shown in FIG. 5, process 500 may include generating a software interface model for communicating with the streaming interface (block 560). For example, client device 210 may generate the software interface model using TCE 220.

The software interface model may include computer code for the software based processing device to communicate with the streaming interface and/or the hardware based processing device. In some implementations, the software interface model may include a software driver that enables the software processing device to access the hardware processing device and/or the streaming interface.

Client device 210 may generate the software interface model based on the type of streaming interface generated, the functional model, and/or the architectural model (e.g., information relating to the hardware based processing device and/or the software based processing device). In some implementations, client device 210 may generate the software interface model and/or the software driver based on an address of the HDL core, an interrupt number of the HDL core, an address of a shared memory region, an interrupt number of the shared memory region, dimensions of a streaming vector interface port, a data-type of the streaming vector interface port, and/or a sample time of the streaming vector interface port. Computer code for the software driver may be based on the software executed by the software based processing device (e.g., an operating system executed by the software based processing device). In some implementations, computer code for the software driver may use a device driver library provided by the software executed by the software based processing device to configure a DMA between the software based processing device and the hardware based processing device. For example, client device 210 may use operating system specific device drivers and operating specific user-space code to configure and instantiate the DMA. Additionally, or alternatively, the computer code for the software driver may use DMA interrupt signals to schedule a streaming data transfer.

As further shown in FIG. 5, process 500 may include generating computer code to execute the functional model on target device 230 based on the implementation model, the streaming interface, the HDL core, and the software interface model (block 570). For example, client device 210 may generate the code using TCE 220.

In some implementations, client device 210 may generate the computer code based on a command (e.g., a single command, such as one click of a mouse, one key press, one double-click of a mouse, etc.). The generated computer code may include, software code (e.g., C code, C++ code, Java code, etc.) and/or hardware code (e.g., very high speed integrated circuit hardware description language (VHDL)

code, Verilog, etc.). The generated computer code may include non-executable code (e.g., code that cannot be executed without further processing, such as un-compiled C code), executable code (e.g., code that can be executed without further processing, such as compiled C code, Java bytecode, object files combined together with linker directives, makefiles, throwaway source code, or the like). The generated computer code may include text files that can be directly executed in conjunction with other executable files (e.g., Python text files, dynamic linked library (DLL) files with text-based combining (e.g., an XML file that describes linkage of modules), or the like).

Additionally, or alternatively, client device 210 may, in response to the command, generate configuration code (e.g., makefiles, project files, interface code, etc.), which may be used to transform the generated computer code into executable code. Additionally, or alternatively, client device 210 may generate hardware system integration tool project, which may be used to synthesize the generated hardware code into bitstream. Additionally, or alternative, client device 210 may, in response to the command, trigger all necessary actions to obtain the executable code (e.g., binaries), such as compilation, linking object files, and/or synthesizing bitstream, and may also output the executable code to the particular target platform for execution by the target platform. Moreover, the executable code may include code for the streaming interface, the HDL core, and the software interface model so that the executable code may be used on the hardware-software co-design platform.

In some implementations, the target device 230 may execute the computer code, while a host application is connected to the executing application on the target platform. For example, a user may initiate an application execution by activating a user interface element associated with TCE 220, such as a menu, button, command line action, etc. In response, client device 210 may generate computer code (e.g., executable code) for the functional model, output this generated code to target device 230, and set up a communication between a host application and a target application on target device 230. After initiating this process (e.g., via a 'one-click build' user action), the user may only be required to confirm actions such as, for example, overwriting existing code, deleting directory structures, resolving choice in communication channels, etc.

As mentioned above, the computer generated code may include device driver code, references to device driver code, device driver libraries, references to device driver libraries, code for the streaming interface, code for the HDL core, code for the other hardware interfaces, and/or code for the software interface model. That is, when generating the code, client device 210 may generate code based on logic of the functional model and may further generate the code based on processing device information (e.g., device driver code, references to device driver code, device driver libraries, references to device driver libraries, code for the streaming interface, code for the HDL core, and/or code for the software interface model). Thus, the generated code may include code based on the functional model and code based on the architectural mode (e.g., device driver code in line with, and/or interspersed with, code based on the functional model).

As further shown in FIG. 5, process 500 may include verifying the computer code at various levels (block 580). For example, client device 210 may verify the computer code using TCE 220.

In some implementations, client device 210 may verify the computer code at an algorithm level represented by the functional model. For example, client device 210 may verify the computer code by simulating the functional model independent of the architectural model and the implementation model. Client device 210 may log input and output signals for the computer code for the functional model and/or a particular part of the functional model to verify that valid signals are output based on particular signals input into the computer code. If the functional model includes a streaming algorithm, client device 210 may verify that the computer code for the streaming algorithm works properly independent of target device 230 that is to implement the streaming algorithm.

In some implementations, client device 210 may verify the computer code at an implementation level of the code. For example, client device 210 may verify the computer code generated for the streaming interface, the HDL core, and/or the software interface model by simulating communication over the streaming interface between the hardware based processing device and the software based processing device. In some implementations, the simulation may include modeling communication pathways (e.g., busses) included in target device 230 and ensuring the generated computer code for the streaming interface, the HDL core, and/or the software interface model provides proper input and/or output of data using the communication pathways. In some implementations, the HDL core and the streaming interface HDL code may be verified using an HDL testbench, and/or simulated in an HDL simulator.

In some implementations, client device 210 may verify the computer code at a board level. In other words, client device 210 may verify that the entire code works together properly by simulating the computer code on target device 230. Client device 210 may use any type of simulation technique, such as real-time simulation (e.g., hardware in the loop) and/or non-real-time simulation techniques (e.g., software in the loop, processor in the loop, interpretive, accelerated simulation through code generation (e.g., through partial code generation), multi-core accelerated simulation, distributed simulation, etc.), to simulate the execution of the computer code on the target hardware (e.g., target device 230). Client device 210 may use an external mode simulation technique to verify the computer code on the target hardware in which client device 210 connects with the target hardware to execute the computer code on the target hardware. In the external mode, client device 210 may monitor the execution of the computer code on the target hardware (e.g., observe the output of the computer code on the target hardware and/or retrieve data from the target hardware based on executing the computer code). Client device 210 may verify and/or modify the computer code based on monitoring the execution of the computer code on the target hardware.

When simulating the execution of the computer code, client device 210 may utilize properties associated with the target hardware. For example, these properties may include processor speed, communication delays, scheduler, etc.

As a result of simulating the computer code and/or verifying the computer code, client device 210 may allow identification of various expected performance metrics associated with the execution of the generated computer code. For example, the simulation may make possible the identification of execution times, memory usage, debugging information (e.g., whether values input and/or output at various stages during execution match expected values), etc. A user may use simulation information to determine whether a particular mapping and/or a particular architecture meets the user's goals, without necessitating that the actual hardware indicated in the architectural model (e.g., target device 230) be present.

In some implementations, if an error is detected at any stage of the verification process, client device 210 may stop the verification process and display error information to the user. Additionally, or alternatively, the verification process may continue until completed and the error information may include information identifying any errors discovered throughout the verification of the computer code. The user may reconfigure the computer code based on the error information and repeat the verification process to verify the reconfigured computer code. Additionally, or alternatively, client device 210 may automatically reconfigure the computer code (e.g., code for the streaming interface, the HDL core, and/or the software driver) and repeat the verification process, for example, until the computer code is properly verified.

As further shown in FIG. 5, process 500 may include outputting the computer code for execution on target device 230 (block 590). For example, client device 210 may output the computer code using TCE 220.

In some implementations, client device 210 may output the computer code to, for example, a file or set of files. Additionally, or alternatively, client device 210 may output the computer code to one or more external devices (e.g., target device 230). In some implementations, client device 210 may compile the computer code, in the instances where the computer code includes un-compiled code. In some implementations, client device 210 may display information indicating communication delay, processing speed, scheduler information, and/or any other type of information associated with one or more portions of the functional model, according to the mapping. In some implementations, this information may be obtained as a result of simulating and/or verifying the computer code.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Implementations described herein may replace a vector based hardware/software modeling boundary with a streaming interface for modeling communication of streaming data on a hardware-software co-design platform.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, and/or a combination of hardware and software.

Certain user interfaces have been described herein and/or shown in the figures. A user interface may include a graphical user interface, a non-graphical user interface, a text-based user interface, etc. A user interface may provide information for display. In some implementations, a user may interact with the information, such as by providing input via an input component of a device that provides the user interface for display. In some implementations, a user interface may be configurable by a device and/or a user (e.g., a user may change the size of the user interface, information provided via the user interface, a position of information provided via the user interface, etc.). Additionally, or alternatively, a user interface may be pre-configured to a standard configuration, a specific configuration based on a type of device on which the user interface is displayed, and/or a set of configurations based on capabilities and/or specifications associated with a device on which the user interface is displayed.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items, and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A computer-readable medium storing instructions, the instructions comprising:
one or more instructions that, when executed by one or more processors, cause the one or more processors to:
receive a first information regarding functional blocks associated with a functional model,
the functional model for exchanging streaming data using a vector based hardware-software modeling boundary;
receive a second information regarding physical devices included in a target device,
the physical devices including a software based processing device and a hardware based processing device;
map the functional blocks to the physical devices,
the functional blocks being mapped to allow the streaming data to be communicated between the software based processing device and the hardware based processing device;
generate a streaming interface for communicating the streaming data between the software based processing device and the hardware based processing device; and
generate computer code for implementing functionality of the functional model on the target device based on the streaming interface, where the one or more instructions, when executed to generate the computer code, cause the one or more processors to:
  identify the vector based hardware-software modeling boundary of the functional model, and
  replace the vector based hardware-software modeling boundary of the functional model with the streaming interface.

2. The computer-readable medium of claim 1, where the one or more instructions, when executed by the one or more processors, further cause the one or more processors to:
  generate a hardware design language (HDL) core for the hardware based processing device,
  the HDL core permitting the streaming data to be communicated between the streaming interface and the hardware based processing device; and
  where the one or more instructions, that cause the one or more processors to generate the computer code, further cause the one or more processors to:
  generate the computer code based on the HDL core, the first information, the second information, the mapping, and the streaming interface.

3. The computer-readable medium of claim 1, where the one or more instructions, when executed by the one or more processors, further cause the one or more processors to:
  generate a software driver for the software based processing device,
  the software driver permitting the streaming data to be communicated between the streaming interface and the software based processing device; and
  where the one or more instructions, that cause the one or more processors to generate the computer code, further cause the one or more processors to:
  generate the computer code based on the software driver, the first information, the second information, the mapping, and the streaming interface.

4. The computer-readable medium of claim 1, where the vector based hardware-software modeling boundary is associated with a serializer and a deserializer included in the functional model.

5. The computer-readable medium of claim 1, where the streaming interface includes at least one of an AXI4-Stream interface, an AXI4-Stream for video interface, a PCI DMA streaming interface, or an Avalon-Stream interface.

6. The computer-readable medium of claim 1, where at least one of the first information or the second information is associated with a hardware-software co-design platform.

7. The computer-readable medium of claim 1, where the streaming data, communicated between the software based processing device and the hardware based processing device, includes at least one of:
  vectors,
  arrays,
  multidimensional arrays, or
  matrices.

8. A method, comprising:
  receiving first information regarding functional blocks associated with a functional model,
    the functional model for exchanging streaming data using a vector based hardware-software modeling boundary,
    the receiving the first information being performed by a computer; receiving second information regarding physical devices included in a target device from a hardware-software co-design platform,
    the physical devices including a software based processing device and a hardware based processing device,
    the receiving the second information being performed by the computer; mapping the functional blocks to the physical devices,
    the mapping the functional blocks being performed by the computer; generating a streaming interface to model communication of the streaming data between the software based processing device and the hardware based processing device,
    the generating the streaming interface being performed by the computer; generating code for implementing functionality of the functional model on the target device based on the streaming interface,
    where the generating the code includes:
      identifying the vector based hardware-software modeling boundary of the functional model, and
      replacing the vector based hardware-software modeling boundary of the functional model with the streaming interface,
    the generating the code being performed by the computer; and
  outputting the code,
    the outputting the code being performed by the computer.

9. The method of claim 8, further comprising:
  verifying the code at a plurality of levels by simulating different portions of the code.

10. The method of claim 8, further comprising:
  verifying the code at an algorithm level by simulating the functional model independent of the second information regarding the physical devices included in the target device.

11. The method of claim 8, further comprising:
  verifying the code at an implementation level by simulating communication over the streaming interface between the hardware based processing device and the software based processing device.

12. The method of claim 11, where the verifying the code at the implementation level further includes:
  generating a model of a communication pathway included in the target device based on the second information; and
  simulating the communication over the streaming interface based on the model of the communication pathway.

13. The method of claim 8, further comprising:
  verifying the code based on simulating execution of the code on the target device.

14. The method of claim 8, where the target device implements a streaming algorithm that includes processing at least one of streaming video data or streaming RF baseband data.

15. The method of claim 8, where the hardware based processing device includes at least one of an application-specific integrated circuit or a field programmable gate array.

16. The method of claim 8, where the software based processing device includes a central processing unit.

17. The method of claim 8, where the streaming data includes at least one of:
  vectors,
  arrays,
  multidimensional arrays, or
  matrices.

18. A device, comprising:
a memory; and
one or more processors to:
receive first information regarding functional blocks associated with a functional model,
the functional model for exchanging streaming data,
the functional model indicating a vector based hardware-software modeling boundary for communication of the streaming data;
receive second information regarding physical devices included in a target device,
the physical devices including a software based processing device and a hardware based processing device;
map the functional blocks to the physical devices; and
generate code for implementing the functional model on the target device based on the first information, the second information, the mapping, and a streaming interface,
where the one or more processors, when generating the code, are to:
identify the vector based hardware-software modeling boundary of the functional model, and
replace the vector based hardware-software modeling boundary of the functional model with the streaming interface.

19. The device of claim 18, where the one or more processors are further to:
generate a software driver for the software based processing device,
the software driver permitting the streaming data to be communicated between the streaming interface and the software based processing device; and
where when generating the code, the one or more processors are further to:
generate the code based on the software driver.

20. The device of claim 18, where the one or more processors are further to:
automatically select the streaming interface with which to replace the vector based hardware-software modeling boundary.

21. The device of claim 18, where the one or more processors are further to:
determine port information for a port included in the target device;
provide the port information via a user interface; and
receive a selection of the streaming interface with which to replace the vector based hardware-software modeling boundary based on providing the port information.

22. The device of claim 18, where the streaming interface, a first set of the functional blocks mapped to the software based processing device, and a second set of the functional blocks mapped to the hardware based processing device are included in a technical computing environment that models the target device.

23. The device of claim 18, where the streaming data includes at least one of:
vectors,
arrays,
multidimensional arrays, or
matrices.

* * * * *